(12) United States Patent
Chen et al.

(10) Patent No.: US 9,799,614 B2
(45) Date of Patent: Oct. 24, 2017

(54) CALIBRATION KITS FOR RF PASSIVE DEVICES

(71) Applicant: Taiwan Semiconductor Manufacturing Company, Ltd., Hsin-Chu (TW)

(72) Inventors: Jie Chen, New Taipei (TW); Hao-Yi Tsai, Hsin-Chu (TW); Hsien-Wei Chen, Hsin-Chu (TW); Hung-Yi Kuo, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/243,293

(22) Filed: Aug. 22, 2016

(65) Prior Publication Data
US 2016/0358867 A1  Dec. 8, 2016

Related U.S. Application Data

(63) Continuation of application No. 13/491,364, filed on Jun. 7, 2012, now Pat. No. 9,425,112.

(51) Int. Cl.
*H01L 33/00* (2010.01)
*H01L 23/66* (2006.01)
(Continued)

(52) U.S. Cl.
CPC .......... *H01L 23/66* (2013.01); *G01R 1/07328* (2013.01); *G01R 35/005* (2013.01);
(Continued)

(58) Field of Classification Search
CPC .............. H01L 23/522; H01L 23/5222; H01L 23/5223; H01L 23/5227; H01L 23/5228; H01L 23/538
See application file for complete search history.

(56) References Cited

U.S. PATENT DOCUMENTS 7,026,175 B2   4/2006   Li et al.
7,423,288 B2   9/2008   Aghababazadeh et al.
(Continued)

FOREIGN PATENT DOCUMENTS

TW    I276147 B    3/2007
TW    I279563 B    4/2007

*Primary Examiner* — Cuong Q Nguyen
(74) *Attorney, Agent, or Firm* — Slater Matsil, LLP

(57) ABSTRACT

A method includes measuring a first calibration kit in a wafer to obtain a first performance data. The wafer includes a substrate, and a plurality of dielectric layers over the substrate. The first calibration kit includes a first passive device over the plurality of dielectric layers, wherein substantially no metal feature is disposed in the plurality of dielectric layers and overlapped by the first passive device. The method further includes measuring a second calibration kit in the wafer to obtain a second performance data. The second calibration kit includes a second passive device identical to the first device and over the plurality of dielectric layers, and dummy patterns in the plurality of dielectric layers and overlapped by the second passive device. The first performance data and the second performance data are de-embedded to determine an effect of metal patterns in the plurality of dielectric layers to overlying passive devices.

20 Claims, 6 Drawing Sheets

(51) Int. Cl.
  *H01L 21/768* (2006.01)
  *H01L 23/522* (2006.01)
  *H01L 49/02* (2006.01)
  *H01L 21/66* (2006.01)
  *G01R 1/073* (2006.01)
  *G01R 35/00* (2006.01)
  *G06F 17/50* (2006.01)
  *H01L 23/528* (2006.01)
  *H01L 23/00* (2006.01)

(52) U.S. Cl.
  CPC .... *G06F 17/5009* (2013.01); *H01L 21/76822* (2013.01); *H01L 22/34* (2013.01); *H01L 23/528* (2013.01); *H01L 23/5226* (2013.01); *H01L 23/5227* (2013.01); *H01L 24/13* (2013.01); *H01L 28/10* (2013.01); *H01L 23/522* (2013.01); *H01L 2223/6627* (2013.01); *H01L 2224/0401* (2013.01); *H01L 2224/131* (2013.01); *H01L 2224/13147* (2013.01); *H01L 2924/1903* (2013.01); *H01L 2924/19011* (2013.01); *H01L 2924/19042* (2013.01)

(56) References Cited

U.S. PATENT DOCUMENTS

| | | | |
|---|---|---|---|
| 7,605,597 | B2 | 10/2009 | Aghababazadeh et al. |
| 8,183,130 | B2 | 5/2012 | Lee et al. |
| 2003/0132374 | A1 | 7/2003 | Wang et al. |
| 2011/0001504 | A1 | 1/2011 | Cho et al. |
| 2011/0101521 | A1 | 5/2011 | Hwang et al. |
| 2013/0234286 | A1* | 9/2013 | Nakashiba ............ H01L 23/522 257/531 |
| 2013/0332092 | A1 | 12/2013 | Chen et al. |
| 2015/0206835 | A1* | 7/2015 | Lamorey ............... H01L 23/522 257/773 |
| 2016/0027690 | A1* | 1/2016 | Nakao ................. H01L 23/5226 438/637 |
| 2016/0284652 | A1* | 9/2016 | Kanaoka ............... H01L 23/522 |

* cited by examiner

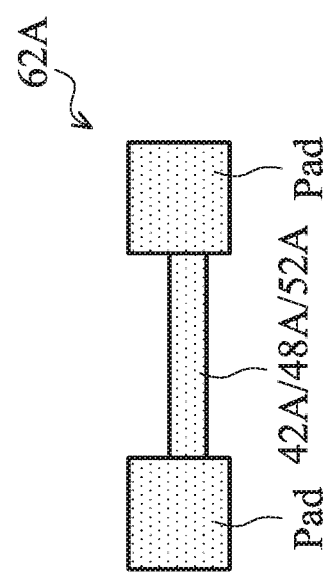
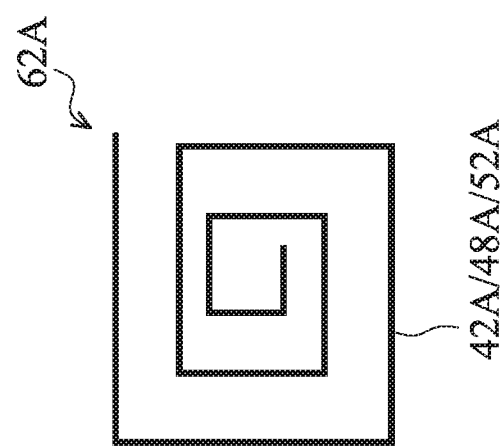
Fig. 3A
Fig. 3B

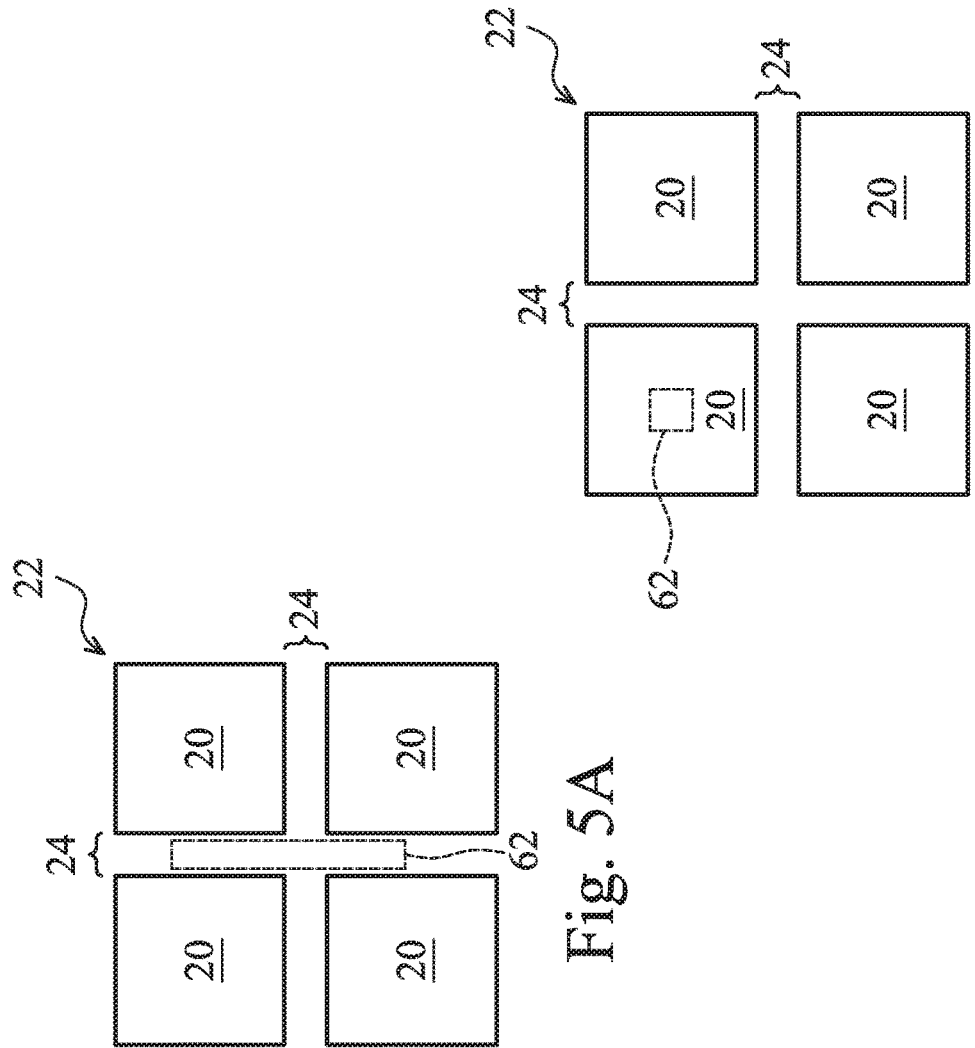

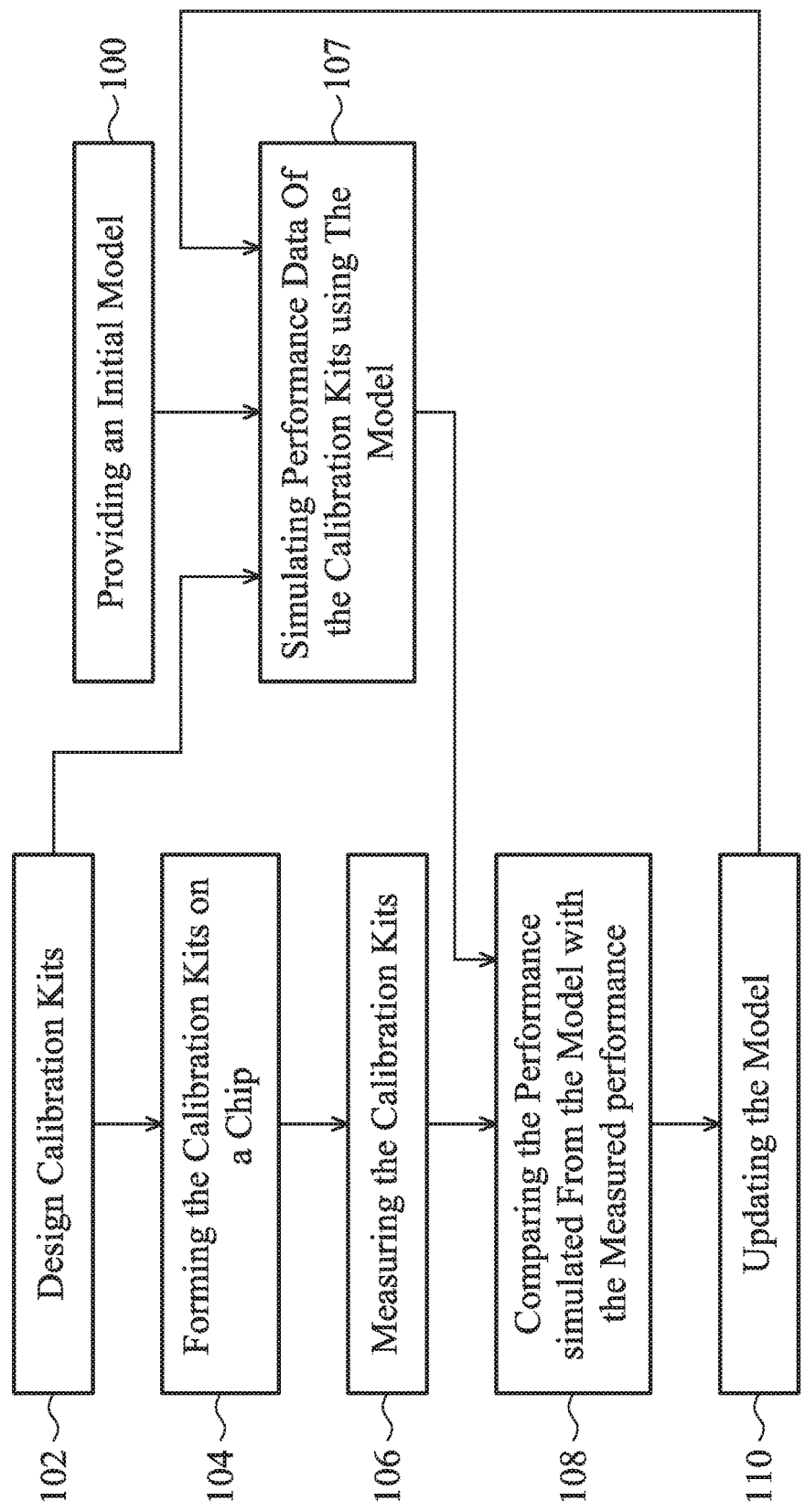

CALIBRATION KITS FOR RF PASSIVE DEVICES

PRIORITY CLAIM AND CROSS-REFERENCE

This application is a continuation of U.S. patent application Ser. No. 13/491,364, entitled "Calibration Kits for RF Passive Devices," filed on Jun. 7, 2012, which application is incorporated herein by reference.

BACKGROUND

Passive devices such as inductors, transformers, transmission lines, or the like are commonly used in Radio Frequency (RF) applications. Due to the short wavelengths of RF signals, RF devices, which have relatively large sizes compared to the small wavelengths, have significant cross-talks with each other, and with nearby conductive components. The performance of the RF devices is thus affected significantly by the nearby conductive features and devices.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 3A and 3B illustrate some exemplary passive devices in the calibration kits;

FIGS. 5A through 5C illustrate exemplary locations on a wafer that are used for placing the calibration kits; and FIG. 6 illustrates a work flow for updating a model, wherein the model is used for simulating the performance data of passive devices, and wherein the simulated performance data is affected by the underlying metal routing.

DETAILED DESCRIPTION

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

Calibration kits of passive devices are provided. Methods for evaluating the effect of routing metal lines in interconnect structures on passive Radio-Frequency (RF) devices are provided in accordance with various exemplary embodiments. Throughout the various views and illustrative embodiments, like reference numbers are used to designate like elements.

Figure 1:
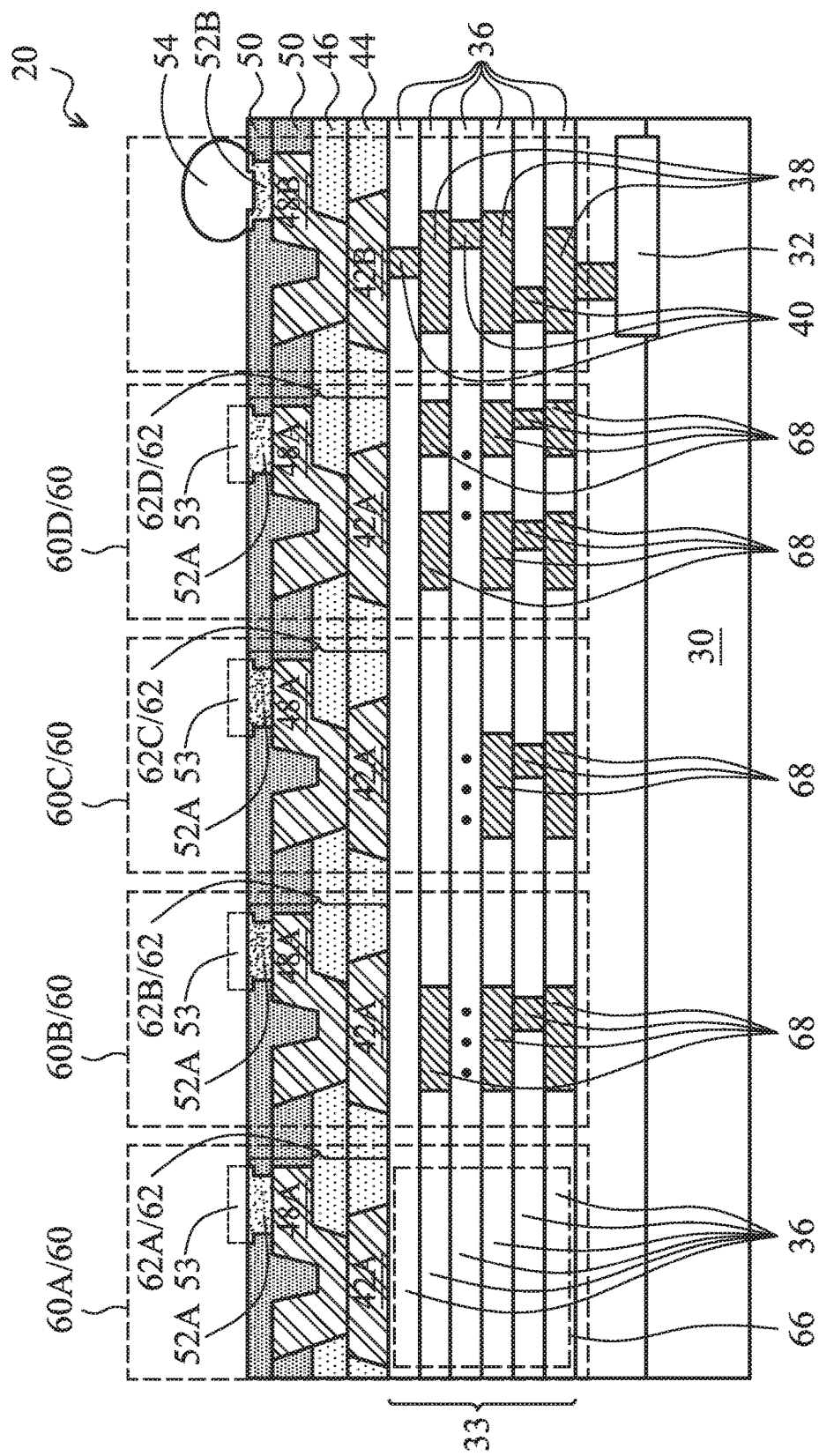
FIG. 1 illustrates a cross-sectional view of a chip comprising calibration kits in accordance with some exemplary embodiments.

FIG. 1 illustrates a cross-sectional view of chip 20 in accordance with exemplary embodiments. In some embodiments, chip 20 is a device chip, and comprises semiconductor substrate 30 therein. Semiconductor substrate 30 in accordance with these embodiments may be a bulk silicon substrate or a silicon-on-insulator substrate. Alternatively, other semiconductor materials including group III, group IV, and group V elements may also be included in semiconductor substrate 30. In some embodiments, chip 20 is a calibration chip that is free from active devices such as transistors therein. In alternative embodiments, chip 20 is a production chip with actual circuits 32 formed therein. The respective chip 20 may be a logic device chip, a memory chip, or the like. Integrated circuits 32 may include Complementary Metal-Oxide-Semiconductor (CMOS) devices therein.

Chip 20 may further include interconnect structure 33 over substrate 30. Interconnect structure 33 includes a plurality of metal layers therein. The metal layers are marked as M1 through Mtop, wherein metal layer M1 is the bottom metal layer, and metal layer Mtop is the top metal layer. Metal layers M1 through Mtop include metal lines 38 formed in dielectric layers 36. Vias 40 are further formed in dielectric layers 36 and interconnect neighboring metal lines 38. In some embodiments, dielectric layers 36 are formed of low-k dielectric materials. The dielectric constants (k values) of the low-k dielectric materials may be less than about 2.8, or less than about 2.5, for example. Metal lines 38 and vias 40 may be formed of copper, a copper alloy, titanium, titanium nitride, tantalum, tantalum nitride, or the alloys thereof.

Metal pad 42B is formed over interconnect structure 3, and may be electrically coupled to circuit 32 through metal lines 38 and vias 40. The metal features formed simultaneously with metal pad 42B are collectively referred to as a metal pad layer hereinafter. Metal pad 42B may be an aluminum pad or an aluminum-copper pad. Passivation layer 44 is formed covering interconnect structure 33. In some embodiments, a portion of passivation layer 44 is level with a portion of metal pad 42B. Passivation layer 44 may include a portion level with metal pad 42B. Although not shown, passivation layer 44 may cover the edge portions of metal pad 42B, while the central portion of the top surface of metal pad 42B is not covered by passivation layer 44. In some embodiments, passivation layer 44 is a composite layer comprising a silicon oxide layer (not shown), and a silicon nitride layer (not shown) over the silicon oxide layer. In alternative embodiments, passivation layer 44 comprises Un-doped Silicate Glass (USG), silicon oxynitride, and/or the like.

Polymer layer 46 is formed over passivation layer 44. Polymer layer 46 may be formed using polyimide, Benzo-CycloButene (BCB), or PolyBenzOxazole (PBO), for example. Over polymer layer 46 are Post-Passivation Interconnects (PPI) 48 (including 48A and 48B). PPIs 48 may be formed of copper or a copper alloy. PPIs 48 include vias that penetrate through the opening in polymer layer 46, and PPI lines over polymer layer 46.

Polymer layer 50 is formed over PPIs 48 and polymer layer 46. Polymer layer 50 may comprise a polymer such as an epoxy, polyimide, BCB, PBO, or the like. Polymer layer 50 may be patterned to form openings, in which Under-Bump Metallurgies (UBMs) 52 (including 52A and 52B) are formed. Electrical connectors 54 are formed on UBMs 52. Electrical connectors 54 may include solder bumps, or copper pillars, for example.

A plurality of calibration kits 60 (including 60A, 60B, 60C, and 60D) are formed in chip 20. Each of calibration kits 60 includes a passive device 62 (denoted as 62A, 62B, 62C, and 62D). Passive devices 62 may be inductors, transformers, baluns, transmission lines such as microstripes or co-planar waveguides, or the like. Passive devices 62 may also be configured to work in an RF range. Each of passive devices 62 may include one, two, or three of metal line 42A (which is formed simultaneously with metal pad 42B), PPI 48A, and UBM 52A, wherein metal pad 42A, PPI 48A, and UBM 52A are formed with a desirable shape (such as coiled) in accordance with the type of the respective passive device 62A. For example, FIG. 3A illustrates the top view of inductor 62A, which includes coiled metal lines that include metal line 42A, PPI 48A, and/or UBM 52A. FIG. 3B illustrates the top view of micro-strip 62A, which includes a straight signal line that further includes metal line 42A, PPI 48A, and/or UBM 52A. In alternative embodiments, each of transmission lines 62 may include a signal line and one or two ground lines (not shown) that are parallel to the signal line. One or two of metal line 42A, PPI 48A, and/or UBM 52A may also be used as the underpass, which is the lead to passive device 62.

Figure 2:
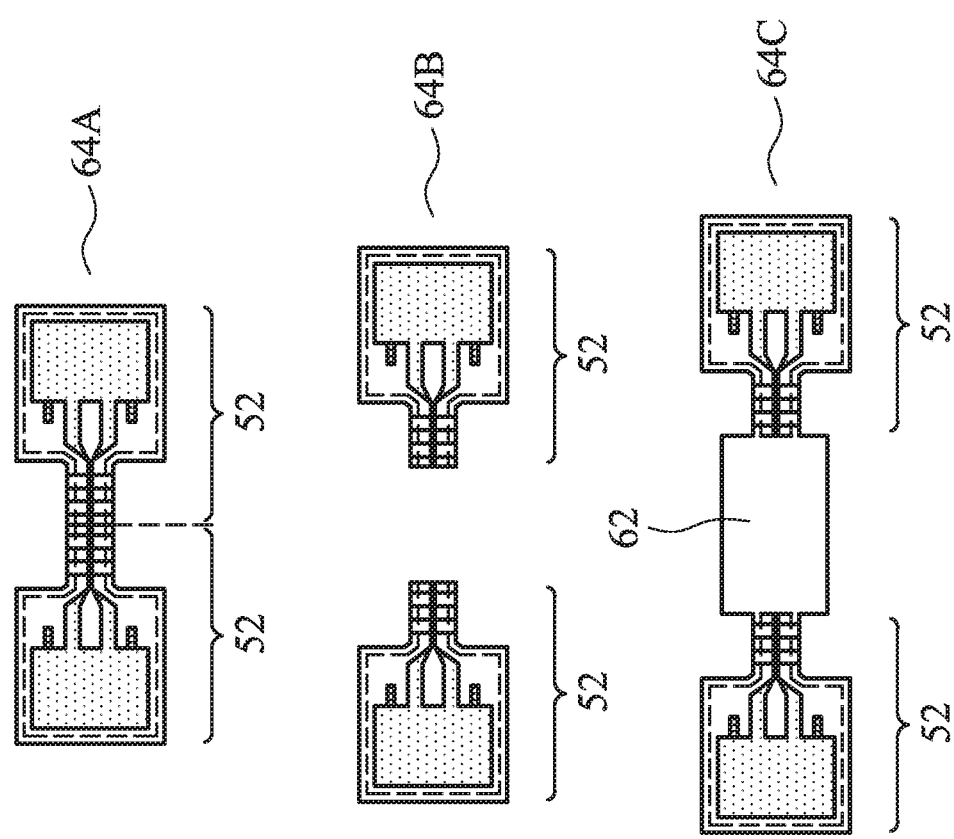
FIG. 2 illustrates an exemplary calibration kit.

Referring back to FIG. 1, each of calibration kits 60 includes two, four, or more probe pads (with one being shown), which is schematically illustrated using UBM 52A. The probe pads may also include additional metal layers 53 over UBMs 52A. FIG. 2 illustrates the top views of an exemplary calibration kit 60. Each of calibration kits 60 may adopt a structure that is adapted for the commonly known open-short de-embedding methods, three-step de-embedding methods (including de-embedding using a short device, an open device, and a through device), or the like. For example, referring to FIG. 2, the illustrated exemplary calibration kit 60 includes short device 64A (wherein probe pads 52 and the respective leads are shorted), open device 64B (wherein test pads 52 and the respective leads are open (disconnected)), and device 64C (wherein the passive device 62 as shown in FIG. 1 is connected between test pads 52 as a device-under-test (DUT)). The passive device 62 in FIG. 2 may be 62A, 62B, 62C, or 62D as in FIG. 1.

Referring to FIG. 1 again, a set of exemplary calibration kits 60 includes calibration kit 60A and at least one of, and possibly a plurality of, calibration kits 60B, 60C, 60D, or the like. Calibration kits 60 have identical passive devices such as 62A, 62B, 62C, and 62, which have an identical size and an identical shape, and are formed simultaneously. Calibration kits 60 are different from each other in that the respective underlying metal routing in metal layers M1 through Mtop are different from each other. For example, calibration kit 60A includes no metal routing in the portions of dielectric layers that are overlapped by the respective passive device 62A, wherein there are dummy metal patterns (dummy metal lines and vias) 68 in calibration kits 60B, 60C, and 60D. Dummy metal patterns 68 in different calibration kits 60B, 60C, and 60D may also be distributed differently in different ones of M1 through Mtop, and/or may have different pattern densities. In some embodiments, dummy patterns 68 are electrically floating, although they can also be electrically coupled to some functional devices such as transistors.

In some exemplary embodiments, in region 66 of calibration kit 60A, which region 66 is the portion of dielectric layers 36 that is overlapped by passive device 62A, no metal line and via are formed. Calibration kit 60B includes a plurality of dummy metal lines/vias 68. In the illustrated embodiments, dummy patterns 68 in calibration kit 60B are distributed in all of dielectric layers 36. Calibration kit 60C is similar to calibrate kit 60B, except that dummy metal lines/vias 68 are formed in some of dielectric layers 36, and not in other one(s) of dielectric layers 36. Calibration kit 60D schematically illustrates that the pattern density of dummy patterns 68 in dielectric layers 36 and underlying passive device 62D is different from the pattern densities of dummy patterns 68 in calibration kits 60B and 60C.

It is appreciated that there is a plurality of metal layers M1 through Mtop (and the respective dielectric layers 36), and dummy patterns 68 may be formed in, or not in, each of metal layers M1 through Mtop. Furthermore, in one of metal layers M1 through Mtop, dummy patterns 68 in different calibration kits 60 may have different pattern densities. For example, assuming 40 percent is the maximum pattern density of the dummy patterns 68 that is in a metal layer and overlapped by one of passive devices 62, with an increment of 5 percent, at least 9 calibration kits 60 may be formed. The respective pattern densities include 0 percent, 5 percent, 10 percent, 15 percent, 20 percent, 25 percent, 30 percent, 35 percent, and 40 percent. If the increment in pattern density is smaller, more calibration kits 60 may be formed. Accordingly, with the available choices of the allocation and the pattern densities of dummy patterns 68, a plurality of calibration kits 60 may be formed.

Figure 4:
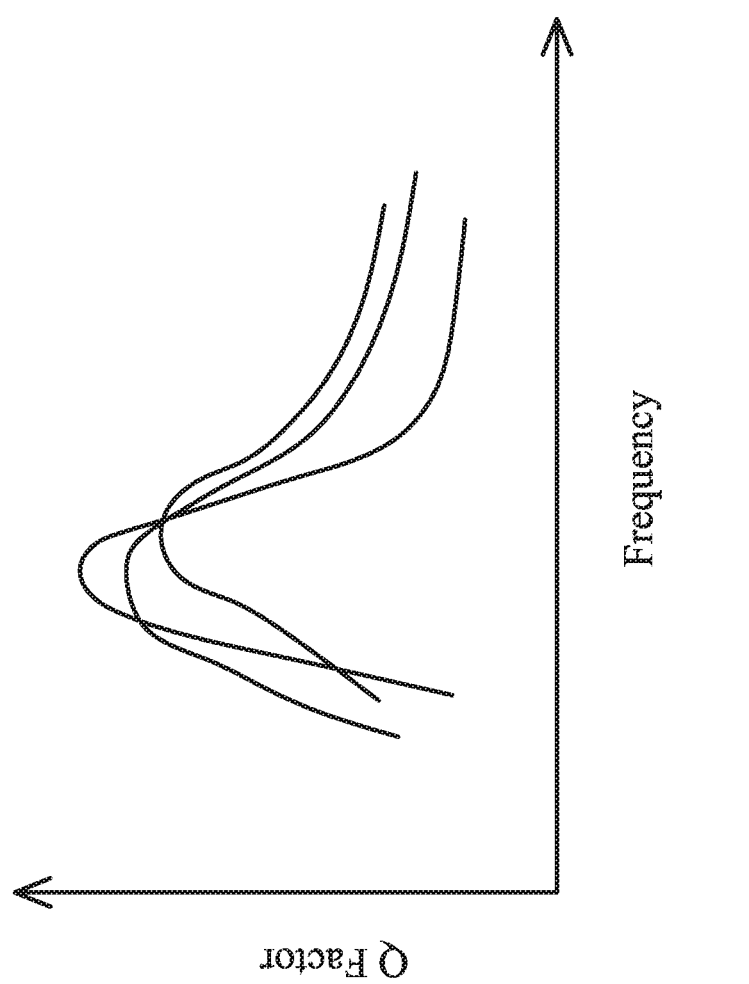
FIG. 4 schematically illustrates exemplary Q factors measured from a calibration kit, wherein the Q factors of a passive device is illustrated as a function of frequency.

For each of calibration kits 60, and using the de-embedding test methods and structures (for example, as shown in FIG. 2), the performance data of each of calibration kits 60 may be measured. The performance data may include the Q factor in response to the frequency change, the inductance in response to the frequency change, and the like, depending on the type of passivation devices 62. FIG. 4 schematically illustrates the measured Q factor of one of calibration kits 60, wherein the Q factor is shown as a function of frequency. The performance data may be measured from devices 64A, 64B, and 64C (FIG. 2). The performance data measured from calibration kits 60A, 60B, 60C, and 60D are different from each other since passive devices 62A, 62B, 62C, and 62D have different underlying dummy metal patterns 68, and hence the respective performance data are affected differently by the respective dummy metal patterns 68. The measured performance data may then be processed/calculated using de-embedding methods that are well known in the art. Through the calculation, the effect of the dummy metal patterns 68 in each of metal layers M1 through Mtop on the performance of the overlying passive device 62 may be calculated. The effect of different pattern densities of dummy metal patterns 68 in each of metal layers M1 through Mtop on the performance of the respective overlying passive device 62 may also be calculated.

FIGS. 5A through 5C illustrate the locations that calibration kits 60 (FIGS. 1 and 2) may be formed in. Referring to FIG. 5A, chips 20 are in wafer 22, and are spaced apart from each other by scribe lines 24. Calibration kits 60 may be formed in scribe lines 24. Since scribe lines 24 are relatively narrow, the calibration kits 60 may include small-size passive devices such as transmission lines, unless other devices such as inductors are small enough to fit into scribe lines 24. Referring to FIG. 5B, calibration kits 60 may be formed at the corners of chips 20 and at the places wherein no bonding pads and solder bumps are to be formed. At the chip corners, transmission lines and large-size passive devices such as transformers, and inductors may also be formed. FIG. 5C illustrates that calibration kits 60 may sometimes be formed at the center of chip 20.

FIG. 6 illustrates an exemplary flow for updating the model for simulating the performance of passive devices, wherein the model takes into account the effect of dummy metal patterns 68 that are in different metal layers and have different pattern densities. Alternatively stated, when using the model to simulate the performance data of a passive device, when the distribution (such as the pattern density or the distributed layers) of the metal routing overlapped by the passive device changes, the resulting simulated performance data also changes. In step 100, an initial model is provided. In step 102, a plurality of calibration kits 60 (FIG. 1) is designed, wherein FIG. 2 schematically illustrates one exemplary calibration kit. The calibration kits 60 have dummy patterns 68 (FIG. 1) in different metal layers, and have different pattern densities. Calibration kits 60 are manufactured on a physical wafer (step 104). The performance of calibration kits 60 are then measured from the wafer (step 106). The performance data of passive devices 62 are further simulated using the model (step 107), and the measured performance data is compared to the performance data simulated using the model (step 108). The comparison results are used to update the model (step 110). The flow then loops back to step 107 to simulate the performance data using the updated model. The loop is repeated until the performance simulated from the model and the performance measured from the manufactured calibration kit match each other. The resulting model then has adequate accuracy, and can be used to guide the passive device design.

By using calibration kits 60, the regions (such as region 66 in FIG. 1) that otherwise cannot be used for metal routing can now be used for routing metals. In the meantime, there is no concern that the effect of the metal routing on the overlying passive device may cause un-predictable degradation to the overlying passive device. Accordingly, calibration kits 60 (FIGS. 1 and 2) may be used for improving the design and the validation of the manufactured circuits. For example, a client may provide a design specification including a specification of the passive device, a specification regarding which of the dielectric layers are to be used for metal routing, and a specification regarding the target pattern density of the metal routing. Calibration kits 60 are then designed, simulated, and/or manufactured, which calibration kits 60 are designed following the design specification. The calibration kits may either be simulated using the model (FIG. 6) and/or be manufactured on wafers. Furthermore, in the calibration kits, the dummy patterns may resemble the actual routing pattern that is to be used by the client, so that the performance of the passive devices in the calibration kits is close to the actual performance of the passive devices. From the calibration kits, the range of the resulting performance of the passive device that follows the design specification may be found through measurement and/or simulation. For example, the client may want metal layer Mtop to be used for routing, and the pattern density of the metal routing is 20 percent, and the client may want the Q factor to reach an expected value. Through the calibration kits, it may be determined that the actual Q factor of the passive device, with the specified metal routing in Mtop layer and having the pattern density 20 percent, is higher than the expected value. In this case, the clients' design specification may be used for mass production. Otherwise, if the actual Q factor is lower than the expected value, the client needs to modify the design.

The calibration kits may also simulate that if the circuit deviates from the specification from the client, how the performance of the passive device will deviate. In this case, one of the calibration kits is designed following the specification, while the other calibration kits are designed close to, and slightly different from the specification. For example, the plurality of calibration kits include seven calibration kits, and the respective patterns densities of the metal routing have the values of 14 percent, 16 percent, 18 percent, 20 percent (the client-specified value), 22 percent, 24 percent, and 26 percent. From the seven calibration kits, seven different Q factors are measured. From the measured Q factors, it can then be determined that if the expected Q factor is not met when the pattern density is 20 percent, how, and by how much, the pattern density should be changed to in order to meet the expected Q factor. In an another example, the client specifies that the Mtop layer has metal routing, while metal layers M1 through Mtop-1 do not have metal routing. Accordingly, one of the calibration kits is designed to have metal routing in the Mtop layer, and another one of the calibration kits is designed to have metal routing in the Mtop-1 layer, so that the respective measured performance data may reflect how the performance data will change if the metal routing is moved down to lower metal layers.

The calibration kits may also be built in the production wafers and/or chips, so that the clients may inline monitor the performance of the passive devices. This helps the validation of the chips, the modification of the design, and the debugging of the design in case the chips fail to meet specification.

In the embodiments, by providing and using calibration kits, the regions in the metal layers and underlying the passive devices may be used for routing, and the effect of the metal routing on the performance of the overlying passive devices can be predicted. The calibration kits may be used for guiding the design of integrated circuits, and used for validating and improving the integrated circuits.

In accordance with embodiments, a method includes measuring a first calibration kit in a wafer to obtain a first performance data. The wafer includes a substrate, and a plurality of dielectric layers over the substrate. The first calibration kit includes a first passive device over the plurality of dielectric layers, wherein substantially no metal feature is disposed in the plurality of dielectric layers and overlapped by the first passive device. The method further includes measuring a second calibration kit in the wafer to obtain a second performance data. The second calibration kit includes a second passive device over the plurality of dielectric layers, and dummy patterns in the plurality of dielectric layers and overlapped by the second passive device. The second passive device is identical to the first device. The method further includes de-embedding the first performance data and the second performance data to determine an effect of metal patterns in the plurality of dielectric layers on overlying passive devices.

In accordance with other embodiments, a method includes designing a plurality of calibration kits from a design specification, wherein the design specification includes a first specification of a passive device, a second specification for routing metal lines in dielectric layers that are under the passive device, wherein the routing metal lines are overlapped by the passive device, and a third specification of pattern densities of the routing metal lines. The method further includes manufacturing a wafer including the plurality of calibration kits. Each of the plurality of calibration kits includes the passive device. The passive devices in the plurality of calibration kits are identical to each other, and the routing metal lines in the plurality of calibration kits are different from each other.

In accordance with yet other embodiments, a device includes a wafer, and first and second calibration kits in the wafer. The wafer includes a substrate, and a plurality of dielectric layers over the substrate. The first calibration kit includes a first passive device over the plurality of dielectric layers, wherein substantially no metal feature is disposed in the plurality of dielectric layers and overlapped by the first passive device. The second calibration kit includes a second passive device over the plurality of dielectric layers, wherein the second passive device is identical to the first passive device. The second calibration kit further includes dummy patterns in the plurality of dielectric layers and overlapped by the second passive device.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
   a chip comprising:
     a substrate; and
     a plurality of dielectric layers over the substrate;
   a first calibration kit in the chip, wherein the first calibration kit comprises:
     a first passive device over the plurality of dielectric layers; and
     first dummy patterns in the plurality of dielectric layers and overlapped by the first passive device, wherein the first dummy patterns are electrically floating; and
   a second calibration kit in the chip, wherein the second calibration kit comprises:
     a second passive device over the plurality of dielectric layers, wherein the second passive device is identical to the first passive device, wherein each of the first and the second calibration kits comprises a probe pad connected to a respective one of the first passive device and the second passive device; and
     second dummy patterns in the plurality of dielectric layers and overlapped by the second passive device, wherein the second dummy patterns are electrically floating, and the first dummy patterns have a first layout different from a second layout of the second dummy patterns.

2. The device of claim 1, wherein the first and the second passive devices comprise portions in a layer selected from the group consisting essentially of a metal pad layer, a Post-Passivation Interconnect (PPI) layer, an Under-Bump Metallurgy (UBM) layer, and combinations thereof.

3. The device of claim 1 further comprising a third calibration kit in the chip, wherein the third calibration kit comprises:
   a third passive device over the plurality of dielectric layers, wherein the third passive device is identical to the first passive device, and wherein no dummy pattern is formed in the region overlapped by the third calibration kit.

4. The device of claim 1 further comprising a third calibration kit in the chip, wherein the third calibration kit comprises:
   a third passive device over the plurality of dielectric layers, wherein the third passive device is identical to the first passive device; and
   third dummy patterns in the plurality of dielectric layers and overlapped by the third passive device, wherein the first, the second, and the third dummy patterns have different pattern densities.

5. The device of claim 1 further comprising a third calibration kit in the chip, wherein the third calibration kit comprises:
   a third passive device over the plurality of dielectric layers, wherein the third passive device is identical to the first passive device; and
   third dummy patterns in the plurality of dielectric layers and overlapped by the third passive device, wherein layouts of the first, the second, and the third dummy patterns are different from each other.

6. The device of claim 1, wherein the first and the second passive devices are level with each other.

7. The device of claim 1 further comprising:
   an Under-Bump Metallurgy (UBM); and
   a solder region over and contacting the UBM, wherein both the first calibration kit and the second calibration kit have top portions extending to a same level as the UBM.

8. The device of claim 1, wherein the first passive device and the second passive device are selected from the group consisting essentially of an inductor, a transformer, a balun, and a transmission line.

9. The device of claim 1, wherein each of the first calibration kit and the second calibration kit comprises four probe pads exposed on a topmost surface of the chip.

10. A device comprising:
    a chip comprising:
      a substrate;
      a plurality of low-k dielectric layers over the substrate;
      a passivation layer over the plurality of low-k dielectric layers; and
      a polymer layer over and in contact with the passivation layer;
    a first calibration kit in the chip, wherein the first calibration kit comprises:
      a first passive device over the plurality of low-k dielectric layers, wherein the first passivation device extends into the passivation layer;
      first dummy patterns in the plurality of low-k dielectric layers, wherein the first dummy patterns are overlapped by the first passive device; and
    a second calibration kit in the chip, wherein the second calibration kit comprises:
      a second passive device in same layers of the chip as the first passive device, wherein the second passive device is identical to the first passive device, and each of the first and the second calibration kits comprises a probe pad connected to the respective first passive device and the second passive device; and
      second dummy patterns in the plurality of low-k dielectric layers and overlapped by the second passive device, wherein the first and the second dummy patterns have different pattern densities.

11. The device of claim 10, wherein the first and the second dummy patterns are electrically floating.

12. The device of claim 10, wherein the chip is free from active devices.

13. The device of claim 10, wherein the first and the second passive devices comprise portions in a top surface layer of the chip.

14. The device of claim 10 further comprising a third calibration kit in the chip, wherein the third calibration kit comprises:
   a third passive device in same layers of the chip as the first passive device, wherein the third passive device is identical to the first passive device, wherein in portions of the plurality of low-k dielectric layers directly underlying the third passive device, no dummy pattern is formed.

15. The device of claim 10, wherein each of the first passive device and the second passive device comprises a plurality of probe pads, with top surfaces of the plurality of probe pads being exposed outside of the chip.

16. The device of claim 10, further comprising:
   an Under-Bump Metallurgy (UBM); and
   a solder region over and contacting the UBM, wherein both the first calibration kit and the second calibration kit have top portions extending to a level of the UBM.

17. The device of claim 10, wherein the first passive device and the second passive device are selected from the group consisting essentially of an inductor, a transformer, a balun, and a transmission line.

18. A device comprising:
   a chip comprising:
      a substrate;
      a plurality of low-k dielectric layers over the substrate;
      a passivation layer over the plurality of low-k dielectric layers, wherein the passivation layer is formed of a non-low-k dielectric material; and
      a polymer layer over the passivation layer; and
   a plurality of calibration kits in the chip, wherein each of the plurality of calibration kits comprises:
      a passive device over the plurality of low-k dielectric layers, wherein the passive devices of the plurality of calibration kits are identical to each other; and
      dummy patterns in the plurality of low-k dielectric layers and overlapped by the respective passive device, wherein the dummy patterns of the plurality of calibration kits have layouts different from each other.

19. The device of claim 18, wherein each of the plurality of calibration kits further comprises a plurality of probe pads electrically connected to the passive device in a respective one of the plurality of calibration kits.

20. The device of claim 19, wherein the dummy patterns are electrically floating.

* * * * *